US009117551B2

(12) United States Patent
Tomoto et al.

(10) Patent No.: US 9,117,551 B2
(45) Date of Patent: Aug. 25, 2015

(54) SRAM MEMORY CARD AND VOLTAGE MONITORING CIRCUIT

(75) Inventors: Chiaki Tomoto, Chiyoda-ku (JP); Masaharu Uji, Kawasaki (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/370,402

(22) PCT Filed: Jan. 13, 2012

(86) PCT No.: PCT/JP2012/050569
§ 371 (c)(1),
(2), (4) Date: Jul. 2, 2014

(87) PCT Pub. No.: WO2013/105261
PCT Pub. Date: Jul. 18, 2013

(65) Prior Publication Data
US 2015/0016182 A1 Jan. 15, 2015

(51) Int. Cl.
*G11C 11/00* (2006.01)
*G11C 29/04* (2006.01)
*G11C 5/14* (2006.01)
*G11C 11/417* (2006.01)
(Continued)

(52) U.S. Cl.
CPC *G11C 29/04* (2013.01); *G11C 5/14* (2013.01); *G11C 5/147* (2013.01); *G11C 11/417* (2013.01); *G11C 11/419* (2013.01); *G11C 29/021* (2013.01); *G11C 2029/0409* (2013.01)

(58) Field of Classification Search
CPC .................................. G11C 7/08; G11C 11/419
USPC ..................................................... 365/154, 205
See application file for complete search history.

(56) References Cited

U.S. PATENT DOCUMENTS 4,965,828 A * 10/1990 Ergott et al. .................. 713/193
5,047,988 A 9/1991 Mizuta
5,128,863 A * 7/1992 Nakamura et al. .............. 463/44
(Continued)

FOREIGN PATENT DOCUMENTS

JP 02-267613 A 11/1990
JP 03-009417 A 1/1991
(Continued)

OTHER PUBLICATIONS

Communication dated Dec. 22, 2014 from the German Patent Office in counterpart application No. 11 2012 005 664.7.
International Search Report of PCT/JP2012/050569 dated Aug. 21, 2012.

*Primary Examiner* — Michael Tran
(74) *Attorney, Agent, or Firm* — Sughrue Mion, PLLC; Richard C. Turner

(57) ABSTRACT

An SRAM memory card includes a monitoring unit that monitors, via a contact, a power supply voltage generated by a battery, set an ON value in an alarm signal when electric potential at the contact is lower than a threshold and set an OFF value in the alarm signal when the electric potential at the contact is equal to or higher than the threshold, and output the alarm signal to an apparatus via an interface unit; a detecting unit that detects an ON/OFF state of the power supply of the apparatus via the interface unit; and a discharge circuit that discharges, according to the ON/OFF state of the power supply of the apparatus detected by the detecting unit, charges accumulated in a first electrode of a capacitive element.

8 Claims, 2 Drawing Sheets

(51) Int. Cl.
*G11C 11/419* (2006.01)
*G11C 29/02* (2006.01)

(56) References Cited

U.S. PATENT DOCUMENTS

| | | | |
|---|---|---|---|
| 2002/0039916 A1* | 4/2002 | Hosoi | 455/572 |
| 2005/0083751 A1 | 4/2005 | Fujiu et al. | |
| 2005/0094474 A1* | 5/2005 | Deng et al. | 365/229 |
| 2006/0069853 A1* | 3/2006 | Beckert et al. | 711/104 |

FOREIGN PATENT DOCUMENTS

| | | |
|---|---|---|
| JP | 04-145715 A | 5/1992 |
| JP | 04-086052 U | 7/1992 |
| JP | 04-326489 A | 11/1992 |
| JP | 05-046122 U | 6/1993 |
| JP | 08-205416 A | 8/1996 |
| JP | 10-040351 A | 2/1998 |

* cited by examiner

SRAM MEMORY CARD AND VOLTAGE MONITORING CIRCUIT

CROSS REFERENCE TO RELATED APPLICATIONS

This is a National Stage of International Application No. PCT/JP2012/050569 filed Jan. 13, 2012, the content of all of which is incorporated herein by reference in its entirety.

FIELD

The present invention relates to an SRAM memory card and a voltage monitoring circuit.

BACKGROUND

An SRAM (Static Random Access Memory) memory card backed up by a battery is detachably inserted into an apparatus such as a PLC (Programmable Logic Controller). When the SRAM memory card is inserted into the apparatus and receives data from the apparatus, the SRAM memory card retains the received data for backup. In the SRAM memory card, when the voltage of the battery drops below a certain level, it is likely that a circuit such as an SRAM cannot retain the data and the data is lost. To prevent this problem, in the SRAM memory card backed up by the battery, when a battery voltage detection circuit detects the drop in the battery voltage, the battery voltage detection circuit outputs an alarm signal having an ON value to the apparatus. The apparatus urges a user to replace the battery. When the SRAM memory card vibrates, in some case, the battery instantaneously causes a connection failure and the battery voltage detection circuit detects a drop in the battery voltage by mistake and erroneously outputs an alarm signal having an ON value. To prevent the instantaneous erroneous output of the alarm signal, in the SRAM memory card backed-up by the battery, a chattering prevention circuit is provided in parallel to the battery. When chattering occurs, the chattering prevention circuit supplies a voltage to the circuit such as the SRAM on behalf of the battery.

On the other hand, Patent Literature 1 describes that, in a chattering prevention circuit, when an output of a comparator, which compares the voltage of a capacitor and a resistance-divided voltage, is inverted when an external switch is on, an NPN transistor, a base of which is connected to an output of the comparator, is turned on, and an emitter current of the NPN transistor is supplied to a base of the NPN transistor connected to both ends of the capacitor by a current mirror. Consequently, according to Patent Literature 1, because the capacitor is quickly discharged, it is possible to prevent chattering from occurring near a threshold of the capacitor.

Patent Literature 2 descries that, in a chattering removal circuit, when the potential of an input node of an inverter having a hysteresis characteristic drops from high potential to a second level, which is intermediate potential, after a switch is turned on, an output of the inverter is inverted from low potential to high potential, a transistor, a base of which is connected to an output side of the inverter, a collector of which is connected to an input node of the inverter, and an emitter of which is connected to ground potential, is turned on, and a capacitor connected to the input node of the inverter is quickly discharged. When the potential of the input node of the inverter rises from the low potential to a first level, which is intermediate potential, the output of the inverter is inverted from the high potential to the low potential, a transistor, a base of which is connected to the output side of the inverter, a collector of which is connected to the input node of the inverter, and an emitter of which is connected to power supply potential, is turned on, and the capacitor connected to the input node of the inverter is quickly charged. Consequently, according to Patent Literature 2, because the capacitor is quickly charged and discharged, even when a chattering phenomenon lasts long, the capacitor is not fully charged. It is possible to surely remove a chattering signal.

Patent Literature 3 describes that, in a power supply circuit of a small electronic device, a logical product of a battery come-off signal that changes to a "H" level when a battery comes off a power supply mounting section, an ON/OFF signal that changes to the "H" level according to an ON state of a power switch, and an output signal of a voltage detector that changes to the "H" level in a state in which a voltage supply level of a Vcc terminal reaches an operable voltage of a CPU is input to a base of a transistor, a collector of which is connected to the Vcc terminal and an emitter of which is connected to a GND terminal. Consequently, according to Patent Literature 3, when the battery comes off the power supply mounting section, accumulated charges in a capacitor in a device circuit are discharged from the Vcc terminal to the GND terminal. Therefore, the CPU does not malfunction with the accumulated charges of the capacitor. It is possible to prevent occurrence of a deficiency such as memory breakage.

CITATION LIST

Patent Literature

Patent Literature 1: Japanese Patent Application Laid-Open No. H4-145715
Patent Literature 2: Japanese Utility Model Publication No. H5-46122
Patent Literature 3: Japanese Utility Model Publication No. H4-86052

SUMMARY

Technical Problem

In the technologies described in Patent Literature 1 and Patent Literature 2, there is no description concerning a battery, there is no description concerning misdetection of a mounting state of a battery, and there is no description concerning how power consumption of a battery is reduced. Even if a constant-current source described in Patent Literature 1 or a direct-current power supply described in Patent Literature 2 is a battery, the technologies described in Patent Literature 1 and Patent Literature 2 are based on the premise that charging and discharging of the capacitor is steadily performed. Therefore, it is difficult to suppress a discharge amount per unit time from the capacitor and it is difficult to reduce the power consumption of the battery.

The technology described in Patent Literature 3 is based on the premise that it is possible to correctly detect whether the battery is mounted on the power supply mounting section. Therefore, there is no description concerning misdetection of a mounting state of the battery. The technology described in Patent Literature 3 is a technology concerning reducing a malfunction of the CPU when the battery comes off the power supply mounting section. Therefore, there is almost no description concerning a state in which the battery is mounted. Therefore, there is no description concerning how power consumption of the battery is reduced.

The present invention has been devised in view of the above, and it is an object of the present invention to obtain a SRAM memory card and a voltage monitoring circuit that can reduce misdetection of a mounting state of a battery at battery unmounted time and reduce power consumption of the battery at battery mounted time.

Solution to Problem

The present invention is directed to an SRAM memory card that achieves the object. The SRAM memory card is detachably inserted into an apparatus containing a power supply and includes an interface unit receiving at least a power supply voltage from the apparatus when the power supply of the apparatus is on in a state in which the SRAM memory card is inserted into the apparatus; a retention related circuit receiving supply of the power supply voltage and performing an operation for retaining data; a contact for electrically connecting to the retention related circuit a battery which generates a power supply voltage; a switching unit switching a supply voltage source such that when the power supply of the apparatus is in an ON state, the power supply voltage received by the interface unit from the apparatus is supplied to the retention related circuit, and when the power supply of the apparatus is in an OFF state, the power supply voltage generated by the battery is supplied to the retention related circuit via the contact; a chattering prevention circuit including a capacitive element containing a first electrode electrically connected to the contact and a second electrode electrically connected to reference electric potential; a monitoring unit monitoring, via the contact, the power supply voltage generated by the battery, setting an ON value in an alarm signal when electric potential at the contact is lower than a threshold and setting an OFF value in the alarm signal when the potential at the contact is equal to or higher than the threshold, and outputting the alarm signal to the apparatus via the interface unit; a detecting unit detecting the ON/OFF state of the power supply of the apparatus via the interface unit; and a discharge circuit discharging charges accumulated in the first electrode of the capacitive element, according to the ON/OFF state of the power supply of the apparatus detected by the detecting unit.

Advantageous Effects of Invention

According to the present invention, it is possible to perform the discharge by the discharge circuit when misdetection of a mounting state of the battery at battery unmounted time could occur and not to perform the discharge by the discharge circuit when misdetection of the mounting state of the battery at the battery unmounted time could not occur. As a result, it is possible to reduce misdetection of the mounting state of the battery at the battery unmounted time and reduce power consumption of the battery at the battery mounted time.

DESCRIPTION OF EMBODIMENTS

An embodiment of an SRAM memory card according to the present invention is explained in detail below with reference to the drawings. Note that the present invention is not limited by the embodiment.

Embodiment

Figure 1:
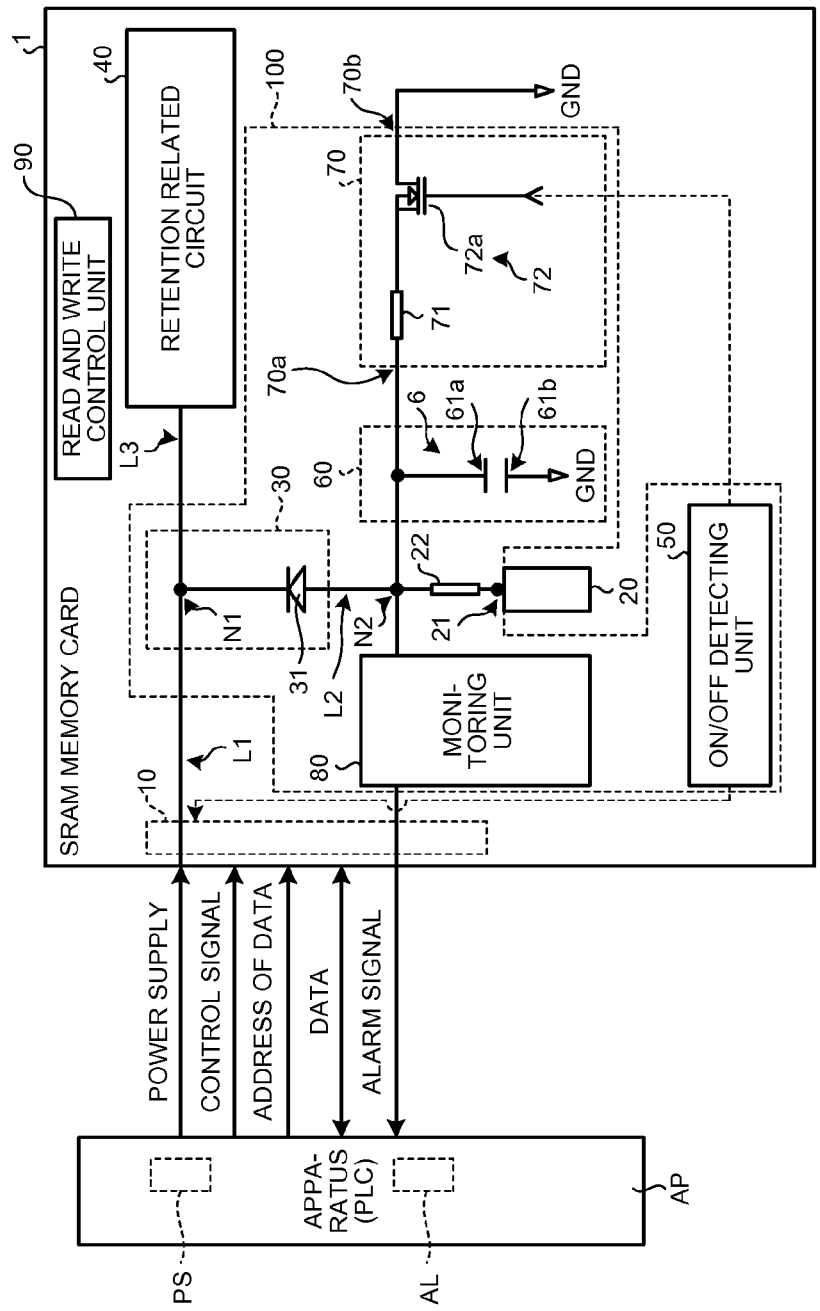
FIG. 1 is a diagram of the configuration of an SRAM memory card according to an embodiment.

An SRAM (Static Random Access Memory) card 1 backed up by a battery 20 is detachably inserted into an apparatus AP as shown in FIG. 1. The apparatus AP is an apparatus including a power supply PS and is, for example, a PLC (Programmable Logic Controller).

When the SRAM memory card 1 is inserted into the apparatus AP, the SRAM memory card 1 receives, in an interface unit 10, a control signal, an address of data, and the data from the apparatus AP as inputs. When a write command is included in the control signal, a read and write control unit 90 transfers the data received by the interface unit 10 to a retention related circuit 40 and writes the data in the retention related circuit 40. The retention related circuit 40 receives supply of a power supply voltage and performs an operation for retaining the data. The retention related circuit 40 includes a memory array of an SRAM and a peripheral circuit (an IC, etc.) of the SRAM. For example, the read and write control unit 90 writes the data in an address in the memory array of the SRAM, corresponding to the address of the data, according to the write command. Alternatively, when a readout command is included in the control signal, the read and write control unit 90 reads out the data from the retention related circuit 40 and transmits the data to the apparatus AP through the interface unit 10.

When the power supply PS of the apparatus AP is on, the SRAM memory card 1 operates with a power supply voltage supplied from the apparatus AP and performs write and readout of the data. That is, when the power supply PS of the apparatus AP is on in a state in which the SRAM memory card 1 is inserted into the apparatus AP, the interface unit 10 receives the power supply voltage from the apparatus AP. When the power supply PS of the apparatus AP is off, the interface unit 10 does not receive the power supply voltage from the apparatus AP.

When the power supply PS of the apparatus AP is in an OFF state, the SRAM memory card 1 changes to a standby state. The retention related circuit 40 performs retention of the data with a power supply voltage supplied from the battery 20. That is, a switching unit 30 switches, according to the ON or OFF state of the power supply PS of the apparatus AP, a supply voltage source to the retention related circuit 40 between the power supply of the apparatus AP and the battery 20 on the inside. Specifically, the switching unit 30 switches the supply voltage source such that, when the power supply PS of the apparatus AP is in the ON state, the power supply voltage received by the interface unit 10 from the apparatus AP is supplied to the retention related circuit 40 through a line L1, a connection node N1, and a line L3 and, when the power supply PS of the apparatus AP is in the OFF state, the power supply voltage generated by the battery 20 is supplied to the retention related circuit 40 via a contact 21 through a resistor 22, a connection node N2, a line L2, the connection node N1, and the line L3.

More specifically, the switching unit 30 includes a diode 31 electrically connected between the connection node N1 of the line L1 and the line L3 and the line L2 such that the power supply voltage supplied from the apparatus AP and the power supply voltage supplied from the battery 20 on the inside do not interfere with each other. The diode 31 is connected such that a direction from the line L2 to the connection node N1 is a forward direction. Consequently, the switching unit 30 can realize the switching operation with a simple configuration.

According to the switching operation of the switching unit 30, when the power supply PS of the apparatus AP is in the OFF state, the power supply voltage generated by the battery 20 is supplied to the retention related circuit 40. However, when the power supply voltage generated by the battery 20 drops to be lower than a certain level, the retention related circuit 40 cannot retain the data. The data is likely to be lost. To prevent this problem, the SRAM memory card 1 backed up by the battery 20 includes a voltage monitoring circuit 100 configured to monitor the voltage of the battery 20 and detect an error. That is, a monitoring unit 80 of the voltage monitoring circuit 100 is electrically connected to the contact 21 via the connection node N2 and the resistor 22. Consequently, the monitoring unit 80 monitors, via the contact 21, the power supply voltage generate by the battery 20. When the monitoring unit 80 detects a drop in the power supply voltage generated by the battery 20, the monitoring unit 80 outputs an alarm signal having an ON value to the apparatus AP through the interface unit 10.

Specifically, the monitoring unit 80 compares the potential or electric potential at the contact 21 and a threshold. The threshold is a potential level experimentally determined in advance taking into account an operation margin of the retention related circuit 40 with respect to a "certain level" at which the retention related circuit 40 cannot retain data. When the potential at the contact 21 is lower than the threshold, the monitoring unit 80 sets an ON value in the alarm signal assuming that a drop in the power supply voltage generated by the battery 20 is detected. When the potential at the contact 21 is equal to or higher than the threshold, the monitoring unit 80 sets an OFF value in the alarm signal assuming that a drop in the power supply voltage generated by the battery 20 is not detected. The monitoring unit 80 outputs the alarm signal to the apparatus AP via the interface unit 10. Consequently, the apparatus AP can check a value of the alarm signal and, if the value of the alarm signal is the ON value, perform, via an alarming unit AL, an alarm for urging the user to replace the battery 20 in the SRAM memory card 1. As a method of the alarm by the alarming unit AL, lighting of an LED lamp, an output of warning sound, an output of a message to a display, an output of announce sound, and the like can be used.

In this case, when the SRAM memory card 1 vibrates, in some case, the battery 20 instantaneously causes a connection failure to the contact 21 and the monitoring unit 80 sets the ON signal in the alarm signal and outputs the alarm signal to the apparatus AP assuming that a drop in the power supply voltage generated by the battery 20 is detected by mistake. To prevent the instantaneous misdetection of the alarm signal, the SRAM memory card 1 includes a chattering prevention circuit 60 in parallel to the battery 20.

Specifically, the chattering prevention circuit 60 includes a capacitive element 61. The capacitive element 61 includes a first electrode 61a and a second electrode 61b. The first electrode 61a is electrically connected to the contact 21 via the connection node N2 and the resistor 22. The second electrode 61b is electrically connected to reference potential (e.g., OND potential). The capacitive element 61 accumulates, in the first electrode 61a, charges corresponding to the power supply voltage generated by the battery 20 and retains a voltage corresponding to the power supply voltage generated by the battery 20. When chattering occurs in which the battery 20 causes an instantaneous connection failure to the contact 21, the capacitive element 61 supplies a power supply voltage to the retention related circuit 40 on behalf of the battery 20. That is, when the battery 20 instantaneously causes a connection failure to the contact 21 because of the vibration of the SRAM memory card 1, the chattering prevention circuit 60 performs backup of the battery 20 such that the ON value is not set in the alarm signal by the monitoring unit 80 by mistake.

It is assumed that the battery 20 is unmounted and the power supply PS of the apparatus AP is in the ON state. In this case, a reverse current (a leak current) from the connection node N1 to the connection node N2 flows to the diode 31. Charges are charged in the first electrode 61a of the capacitive element 61 of the chattering prevention circuit 60. When the charges are accumulated in the capacitive element 61 of the chattering prevention circuit 60, even when the battery 20 is unmounted, the capacitive element 61 supplies the power supply voltage on behalf of the battery 20. If the battery 20 is unmounted, the monitoring unit 80 sets the ON value in the alarm signal and outputs the alarm signal to the apparatus AP because the power supply voltage generated by the battery 20 is zero. However, because the potential of the contact 21 is equal to or higher than the threshold, the monitoring unit 80 detects by mistake that the battery 20 is mounted, sets the OFF value in the alarm signal, and erroneously outputs the alarm signal to the apparatus AP. To prevent the erroneous output, the SRAM memory card 1 includes a discharge circuit 70 configured to discharge the charges accumulated in the first electrode 61a of the capacitive element 61 of the chattering prevention circuit 60. That is, the discharge circuit 70 discharges the charges of the first electrode 61a of the capacitive element 61 of the chattering prevention circuit 60, and sets the potential at the contact 21 to be equal to or lower than the threshold.

Specifically, the discharge circuit 70 includes one end 70a, the other end 70b, and a switch 72. The one end 70a is electrically connected to the first electrode 61a of the capacitive element 61. The other end 70b is electrically connected to the reference potential (e.g., the GND potential). The switch 72 electrically connects the one end 70a and the other end 70b to thereby discharge the charges accumulated in the first electrode 61a of the capacitive element 61 to the reference potential.

The switch 72 includes, for example, a field effect transistor 72a. One of a source and a drain of the field effect transistor 72a is connected to the one end 70a and the other is connected to the other end 70b. The field effect transistor 72a is turned on when a control signal at an active level is supplied to a gate of the field effect transistor 72a to thereby electrically connect the one end 70a and the other end 70b and discharge the charges accumulated in the first electrode 61a of the capacitive element 61 to the reference potential.

Consequently, when the battery 20 is in the unmounted state (a noncontact time is not instantaneous), it is possible to suppress the chattering prevention circuit 60 from performing the backup of the battery 20 and reduce misdetection of the mounted state of the battery 20 by the monitoring unit 80.

When the inventor performed the examination, in the SRAM memory card 1, it is unnecessary to steadily perform the discharge of the charges accumulated in the first electrode 61a of the capacitive element 61. As explained above, it is sufficient to perform the discharge of the charges when the battery 20 is unmounted and the power supply PS of the apparatus AP is in the ON state. On the contrary, when the power supply PS of the apparatus AP is in the OFF state, the reverse current of the diode 31 does not flow and the charging in the first electrode 61a could not occur. Therefore, it is unnecessary to discharge the charges from the first electrode 61a. It is considered difficult to perform the detection of the mounting state of the battery 20 not via the potential at the contact 21. However, it is considered possible to perform the detection of the ON/OFF state of the power supply PS of the apparatus AP.

Under such an examination, the inventor reached an idea that the ON/OFF state of the power supply PS of the apparatus AP should be detected in the SRAM memory card 1. As explained above, when the power supply PS of the apparatus AP is on in a state in which the SRAM memory card 1 is inserted into the apparatus AP, the interface unit 10 receives the power supply voltage from the apparatus AP. When the power supply PS of the apparatus AP is off, the interface unit 10 does not receive the power supply voltage from the apparatus AP. That is, it is possible to detect the ON/OFF state of the power supply PS of the apparatus AP by detecting whether the interface unit 10 receives the power supply voltage. Therefore, an ON/OFF detecting unit 50 inquires the interface unit 10 about whether the interface unit 10 receives the power supply. According to a result of the inquiry, the ON/OFF detecting unit 50 detects the ON/OFF state of the power supply PS of the apparatus AP. That is, the ON/OFF detecting unit 50 detects the ON/OFF state of the power supply PS of the apparatus AP via the interface unit 10.

When the ON/OFF detecting unit 50 detects the ON state of the power supply PS of the apparatus AP, the ON/OFF detecting unit 50 generates a control signal at an active level and supplies the control signal to a control terminal of the switch 72. When the ON/OFF detecting unit 50 detects the OFF state of the power supply PS of the apparatus AP, the ON/OFF detecting unit 50 generates a control signal at a non-active level and supplies the control signal to the control terminal of the switch 72.

For example, when the ON/OFF detecting unit 50 detects the ON state of the power supply PS of the apparatus AP, the ON/OFF detecting unit 50 generates the control signal at the active level and supplies the control signal to the gate of the field effect transistor 72a. When the ON/OFF detecting unit 50 detects the OFF state of the power supply PS of the apparatus AP, the ON/OFF detecting unit 50 generates the control signal at the non-active level and supplies the control signal to the gate of the field effect transistor 72a.

According to the ON/OFF state of the power supply PS of the apparatus AP detected by the ON/OFF detecting unit 50, the discharge circuit 70 discharges the charges accumulated in the first electrode 61a of the capacitive element 61.

That is, when the power supply PS of the apparatus AP is in the ON state, the switch 72 of the discharge circuit 70 receives the control signal at the active level from the ON/OFF detecting unit 50 and electrically connects the one end 70a and the other end 70b. Consequently, the discharge circuit 70 discharges the charges accumulated in the first electrode 61a of the capacitive element 61 to the reference potential. Alternatively, when the power supply PS of the apparatus AP is in the OFF state, the switch 72 of the discharge circuit 70 receives the control signal at the non-active level from the ON/OFF detecting unit 50 and electrically disconnects the one end 70a and the other end 70b. Consequently, the discharge circuit 70 does not discharge the charges accumulated in the first electrode 61a of the capacitive element 61 to the reference potential.

For example, when the power supply PS of the apparatus AP is in the ON state, the field effect transistor 72a of the discharge circuit 70 receives, in the gate, the control signal at the active level from the ON/OFF detecting unit 50 and electrically connects the one end 70a and the other end 70b. Consequently, the discharge circuit 70 discharges the charges accumulated in the first electrode 61a of the capacitive element 61 to the reference potential. Alternatively, for example, when the power supply PS of the apparatus AP is in the OFF state, the field effect transistor 72a of the discharge circuit 70 receives, in the gate, the control signal at the non-active level from the ON/OFF detecting unit 50 and electrically disconnects the one end 70a and the other end 70b. Consequently, the discharge circuit 70 does not discharge the charges accumulated in the first electrode 61a of the capacitive element 61 to the reference potential.

Further, the discharge circuit 70 includes a resistance element 71 connected to the switch 72 (e.g., a field effect transistor 72a) in series between the one end 70a and the other end 70b. The resistance element 71 is inserted into a discharge path in series. Therefore, by setting a resistance value of the resistance element 71 moderately large in advance, it is possible to limit a discharge amount per unit time by the discharge circuit 70.

As explained above, in the embodiment, the ON/OFF detecting unit 50 detects the ON/OFF state of the power supply PS of the apparatus AP via the interface unit 10. The discharge circuit 70 discharges, according to the ON/OFF state of the power supply PS of the apparatus AP detected by the ON/OFF detecting unit 50, the charges accumulated in the first electrode 61a of the capacitive element 61. Consequently, it is possible to perform the discharge by the discharge circuit 70 when misdetection of a mounting state of the battery at battery unmounted time could occur and not to perform the discharge by the discharge circuit 70 when misdetection of the mounting state of the battery at the battery unmounted time could not occur. As a result, it is possible to reduce misdetection of the mounting state of the battery at the battery unmounted time and reduce power consumption of the battery at the battery mounted time.

Therefore, because it is possible to reduce misdetection of the mounting state of the battery at the battery unmounted time, it is possible to improve reliability of the SRAM memory card 1. Because it is possible to reduce power consumption of the battery at the battery mounted time, it is possible to suppress a decrease in the life of the battery. Consequently, it is possible to reduce a frequency of replacement of the battery and it is possible to realize an SRAM memory card that is easily maintained.

In the embodiment, when the power supply PS of the apparatus AP is in the ON state, the discharge circuit 70 discharges the charges accumulated in the first electrode 61a of the capacitive element 61. When the power supply PS of the apparatus AP is in the OFF state, the discharge circuit 70 does not discharge the charges accumulated in the first electrode 61a of the capacitive element 61. Consequently, it is possible to perform the discharge by the discharge circuit 70 when misdetection of a mounting state of the battery at battery unmounted time could occur and not to perform the discharge by the discharge circuit 70 when misdetection of the mounting state of the battery at the battery unmounted time could not occur.

In the embodiment, the discharge circuit 70 includes the one end 70a electrically connected to the first electrode 61a of the capacitive element 61, the other end 70b electrically connected to the reference potential (e.g., the GND potential), and the switch 72 configured to electrically connect the one end 70a and the other end 70b. Consequently, when the power supply PS of the apparatus AP is in the ON state, it is possible to realize, with a simple configuration, a circuit that discharges, when the power supply PS of the apparatus AP is in the ON state, the charges accumulated in the first electrode 61a of the capacitive element 61 and does not discharge, when the power supply PS of the apparatus AP is in the OFF state, the charges accumulated in the first electrode 61a of the capacitive element 61.

In the embodiment, the switch 72 electrically connects the one end 70a and the other end 70b of the discharge circuit 70 when the power supply PS of the apparatus AP is in the ON state and electrically disconnects the one end 70a and the other end 70b of the discharge circuit 70 when the power supply PS of the apparatus AP is in the OFF state. Consequently, it is possible to perform the discharge by the discharge circuit 70 when misdetection of a mounting state of the battery at battery unmounted time could occur and not to perform the discharge by the discharge circuit 70 when misdetection of the mounting state of the battery at the battery unmounted time could not occur.

In the embodiment, the switch 72 includes the field effect transistor 72a. When the power supply PS of the apparatus AP is in the ON state, the control signal at the active level is supplied to the gate of the field effect transistor 72a. When the power supply PS of the apparatus AP is in the OFF state, the control signal at the non-active level is supplied to the gate of the field effect transistor 72a. Consequently, it is possible to electrically connect the one end 70a and the other end 70b of the discharge circuit 70 when the power supply PS of the apparatus AP is in the ON state and electrically disconnect the one end 70a and the other end 70b of the discharge circuit 70 when the power supply PS of the apparatus AP is in the OFF state. Further, it is possible to easily limit an electric current flowing to the discharge path compared with when the switch 72 is a bipolar transistor. From this viewpoint, it is also possible to reduce power consumption of the battery at the battery mounted time.

In the embodiment, the discharge circuit 70 includes the resistance element 71 connected to the switch 72 in series between the one end 70a and the other end 70b. The resistance element 71 is inserted into the discharge path in series. Therefore, by setting a resistance value of the resistance element 71 moderately large in advance, it is possible to limit a discharge amount per unit time by the discharge circuit 70.

Figure 2:
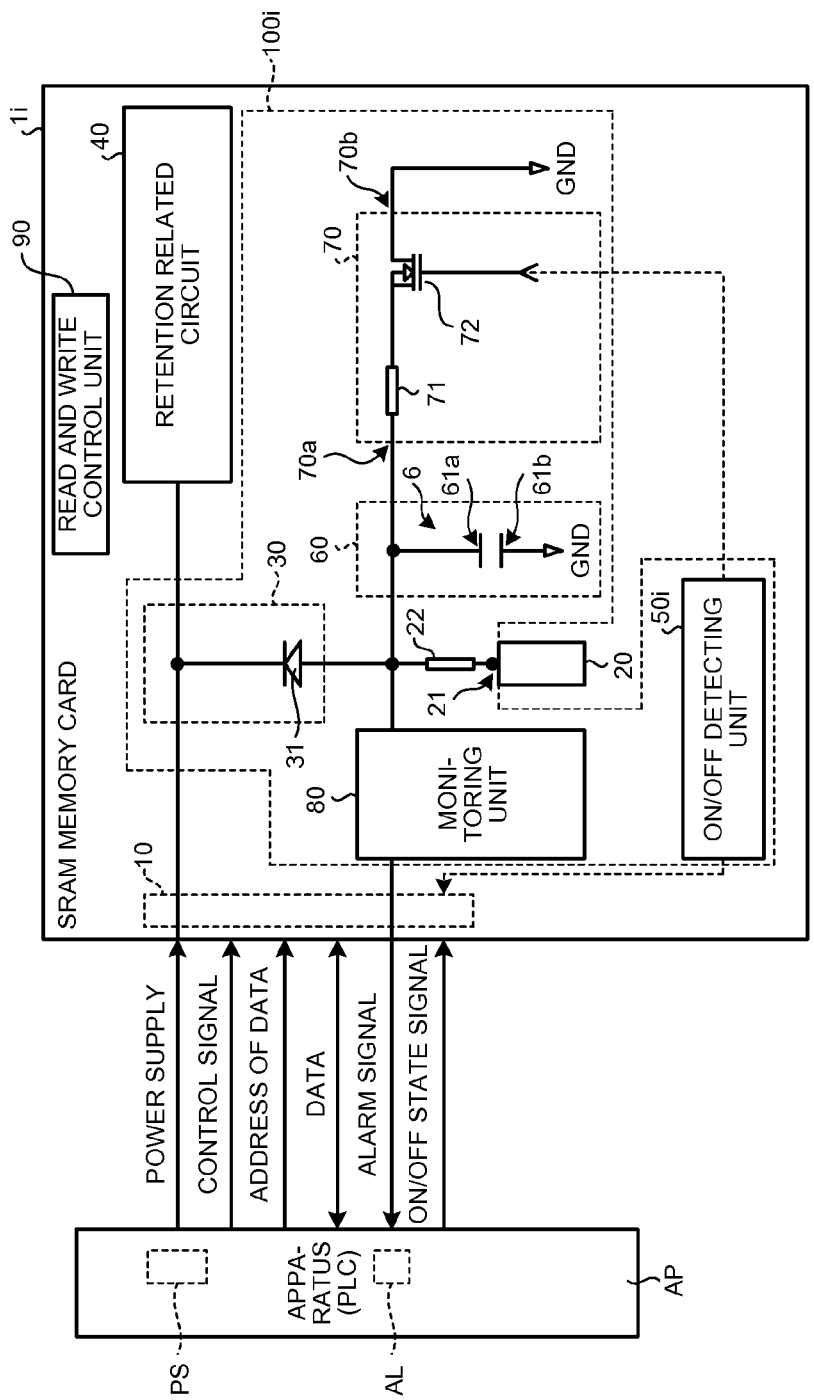
FIG. 2 is a diagram of the configuration of an SRAM memory card according to a modification of the embodiment.

Note that, as shown in FIG. 2, in an SRAM memory card 1i, an ON/OFF detecting unit 50i can detect the ON/OFF state of the power supply PS of the apparatus AP by acquiring an ON/OFF state signal (e.g., a reset signal) indicating the ON/OFF state of the power supply PS of the apparatus AP from the apparatus AP via the interface unit 10.

INDUSTRIAL APPLICABILITY

As explained above, the SRAM memory card according to the present invention is useful for backup of data of a programmable logic controller.

REFERENCE SIGNS LIST 1, 1i SRAM memory cards
10 Interface unit
20 Battery
21 Contact
22 Resistor
30 Switching unit
31 Diode
40 Retention related circuit
50, 50i ON/OFF detecting unit
60 Chattering prevention circuit
61 capacitive element
61a First electrode
61b Second electrode
70 Discharge circuit
70a One end
70b The other end
71 Resistance element
72 Switch
72a Field effect transistor
80 Monitoring unit
90 Read and write control unit
100 Voltage monitoring circuit

The invention claimed is:

1. An SRAM memory card detachably inserted into an apparatus including a power supply, the SRAM memory card comprising:
    an interface unit receiving at least a power supply voltage from the apparatus when the power supply of the apparatus is on in a state in which the SRAM memory card is inserted into the apparatus;
    a retention related circuit receiving supply of the power supply voltage and performing an operation for retaining data;
    a contact for electrically connecting to the retention related circuit a battery which generates a power supply voltage;
    a switching unit switching a supply voltage source such that when the power supply of the apparatus is in an ON state, the power supply voltage received by the interface unit from the apparatus is supplied to the retention related circuit, and when the power supply of the apparatus is in an OFF state, the power supply voltage generated by the battery is supplied to the retention related circuit via the contact;
    a chattering prevention circuit including a capacitive element containing a first electrode electrically connected to the contact and a second electrode electrically connected to reference electric potential;
    a monitoring unit monitoring, via the contact, the power supply voltage generated by the battery, setting an ON value in an alarm signal when electric potential at the contact is lower than a threshold and setting an OFF value in the alarm signal when the potential at the contact is equal to or higher than the threshold, and outputting the alarm signal to the apparatus via the interface unit;
    a detecting unit detecting the ON/OFF state of the power supply of the apparatus via the interface unit; and
    a discharge circuit discharging charges accumulated in the first electrode of the capacitive element, according to the ON/OFF state of the power supply of the apparatus detected by the detecting unit.

2. The SRAM memory card according to claim 1, wherein when the power supply of the apparatus is in the ON state, the discharge circuit discharges the charges accumulated in the first electrode of the capacitive element, and when the power supply of the apparatus is in the OFF state, does not discharge the charges accumulated in the first electrode of the capacitive element.

3. The SRAM memory card according to claim 1, wherein the discharge circuit includes:
    one end electrically connected to the first electrode of the capacitive element;
    other end electrically connected to the reference electric potential; and
    a switch that electrically connects the one end and the other end.

4. The SRAM memory card according to claim 3, wherein the switch electrically connects the one end and the other end of the discharge circuit when the power supply of the apparatus is in the ON state, and electrically disconnects the one end and the other end of the discharge circuit when the power supply of the apparatus is in the OFF state.

5. The SRAM memory card according to claim 4, wherein the switch includes a field effect transistor, to a gate of which a control signal at an active level is supplied when the power supply of the apparatus is in the ON state, and a control signal at a non-active level is supplied when the power supply of the apparatus is in the OFF state.

6. The SRAM memory card according to claim 5, wherein the discharge circuit further includes a resistance element connected to the switch in series between the one end and the other end.

7. A voltage monitoring circuit of an SRAM memory card detachably inserted into an apparatus including a power supply, the voltage monitoring circuit comprising:
   a contact for electrically connecting to a retention related circuit a battery which generates a power supply voltage;
   a switching unit switching a supply voltage source such that when the power supply of the apparatus is in an ON state, a power supply voltage received from the apparatus by an interface unit of the SRAM memory card is supplied to the retention related circuit, and when the power supply of the apparatus is in an OFF state, the power supply voltage generated by the battery of the SRAM memory card is supplied to the retention related circuit;
   a chattering prevention circuit including a capacitive element containing a first electrode electrically connected to the contact and a second electrode electrically connected to reference electric potential;
   a monitoring unit monitoring, via the contact, the power supply voltage generated by the battery, setting an ON value in an alarm signal when electric potential at the contact is lower than a threshold and setting an OFF value in the alarm signal when the potential at the contact is equal to or higher than the threshold, and output the alarm signal to the apparatus via the interface unit;
   a detecting unit configured to detect the ON/OFF state of the power supply of the apparatus via the interface unit; and
   a discharge circuit configured to discharge, according to the ON/OFF state of the power supply of the apparatus detected by the detecting unit, charges accumulated in the first electrode of the capacitive element.

8. The voltage monitoring circuit according to claim 7, wherein when the power supply of the apparatus is in the ON state, the discharge circuit discharges the charges accumulated in the first electrode of the capacitive element, and when the power supply of the apparatus is in the OFF state, does not discharge the charges accumulated in the first electrode of the capacitive element.

* * * * *